(12) United States Patent
Breukers et al.

(10) Patent No.: US 8,891,063 B2
(45) Date of Patent: Nov. 18, 2014

(54) LITHOGRAPHIC APPARATUS AND DEVICE MANUFACTURING METHOD

(75) Inventors: Marcus Joseph Elisabeth Godfried Breukers, Eindhoven (NL); Marcel François Heertjes, Best (NL); Niels Johannes Maria Bosch, Venlo (NL)

(73) Assignee: ASML Netherlands B.V., Veldhoven (NL)

( * ) Notice: Subject to any disclaimer, the term of this patent is extended or adjusted under 35 U.S.C. 154(b) by 213 days.

(21) Appl. No.: 13/335,212

(22) Filed: Dec. 22, 2011

(65) Prior Publication Data

US 2012/0188528 A1    Jul. 26, 2012

Related U.S. Application Data

(60) Provisional application No. 61/434,673, filed on Jan. 20, 2011.

(51) Int. Cl.
| | | |
|---|---|---|
| *G03B 27/32* | (2006.01) | |
| *G03B 27/42* | (2006.01) | |
| *G03B 27/58* | (2006.01) | |
| *G03F 7/20* | (2006.01) | |

(52) U.S. Cl.
CPC ........ *G03F 7/70725* (2013.01); *G03F 7/70733* (2013.01)
USPC .................................. 355/72; 355/53; 355/77

(58) Field of Classification Search
CPC ..... G03F 7/70; G03F 7/707; H01L 21/68707; H01L 21/68742
USPC .............................. 310/12.06; 355/53, 72, 77; 356/399–401; 414/935, 941; 430/22, 430/30
See application file for complete search history.

(56) References Cited

U.S. PATENT DOCUMENTS

| | | | |
|---|---|---|---|
| 4,952,858 | A | 8/1990 | Galburt |
| 5,566,076 | A | 10/1996 | Kuroda |
| 7,397,940 | B2 | 7/2008 | Willems van Dijk et al. |
| 7,486,384 | B2 | 2/2009 | Tinnemans et al. |
| 2004/0176861 | A1* | 9/2004 | Butler ............................. 700/63 |

(Continued)

FOREIGN PATENT DOCUMENTS

| | | |
|---|---|---|
| JP | 2001-358063 A | 12/2001 |
| JP | 2007-150280 A | 6/2007 |

(Continued)

OTHER PUBLICATIONS

English-Language Abstract for Japanese Patent Publication No. 2007-150280 A, published Jun. 14, 2007; 1 page.

(Continued)

*Primary Examiner* — Colin Kreutzer
(74) *Attorney, Agent, or Firm* — Sterne, Kessler, Goldstein & Fox P.L.L.C.

(57) ABSTRACT

A lithographic apparatus comprises an object table for receiving an object, an actuator for moving the object table and a handler for transferring the object to or from the object table. The apparatus is provided with a controller operable connected with the actuator and/or the handler. The controller is programmed and/or arranged to drive the actuator and the handler so as to provide that the object table and the handler substantially follow each other in a direction perpendicular to a transfer direction during transfer in the transfer direction of the object to or from the object table.

17 Claims, 4 Drawing Sheets

(56) References Cited

U.S. PATENT DOCUMENTS

| | | |
|---|---|---|
| 2005/0018167 A1* | 1/2005 | Hennus et al. ............... 355/72 |
| 2005/0128460 A1 | 6/2005 | Van Den Biggelaar et al. |
| 2006/0156981 A1* | 7/2006 | Fondurulia et al. ........... 118/715 |
| 2007/0290150 A1 | 12/2007 | Krupyshev et al. |
| 2009/0003906 A1 | 1/2009 | Takeuchi et al. |
| 2009/0033906 A1* | 2/2009 | Kumazaki ...................... 355/72 |
| 2010/0195074 A1* | 8/2010 | Sogard ............................ 355/67 |
| 2012/0073461 A1 | 3/2012 | Terada et al. |

FOREIGN PATENT DOCUMENTS

| | | |
|---|---|---|
| JP | 2009-123860 A | 6/2009 |
| JP | 2010-219190 A | 9/2010 |
| JP | 2011-000805 A | 1/2011 |
| TW | 200745792 A | 12/2007 |

OTHER PUBLICATIONS

English-Language Abstract for Japanese Patent Publication No. 2009-123860 A, published Jun. 4, 2009; 1 page.

English-Language Abstract for Japanese Patent Publication No. 2010-219190 A, published Sep. 30, 2010; 1 page.

English-Language Abstract for Taiwanese Patent Publication No. 200745792 A, published Dec. 16, 2007; 1 page.

* cited by examiner

LITHOGRAPHIC APPARATUS AND DEVICE MANUFACTURING METHOD

CROSS REFERENCE TO RELATED APPLICATIONS

This application claims the benefit under 35 U.S.C. §119(e) to U.S. Provisional Patent Application No. 61/434,673, filed Jan. 20, 2011, which is incorporated by reference herein in its entirety.

BACKGROUND

1. Field of the Present Invention

The present invention relates to a lithographic apparatus and a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern be formed on an individual layer of the IC. This pattern can be transferred onto a target portion (e.g., including part of, one, or several dies) on a substrate (e.g., a silicon wafer) Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The lithographic apparatus comprises an object table for receiving an object. The apparatus is provided with an actuator for moving the object table and a handler for moving the object to or from the object table. Vibrations between the object table and the handler may aversively effect the apparatus.

SUMMARY

It is desirable to minimize the effects of vibrations between the object table and the handler.

According to an embodiment of the present invention, there is provided a lithographic apparatus comprising an object table for receiving an object, an actuator for moving the object table, a handler for transferring the object to or from the object table, and a controller operable connected with the actuator and/or the handler. The controller is programmed and/or arranged to drive the actuator and the handler, so as to provide that the object table and the handler substantially follow each other in a direction perpendicular to a transfer direction during transfer in the transfer direction of the object to or from the object table.

According to a further embodiment of the present invention there is provided a device manufacturing method comprising transferring an object from a handler to an object table, or vice versa, in a transfer direction and controlling the position of the handler and or the object table in a direction perpendicular to the transfer direction during transfer. The object table and the handler follow each other in the direction perpendicular to the transfer direction.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
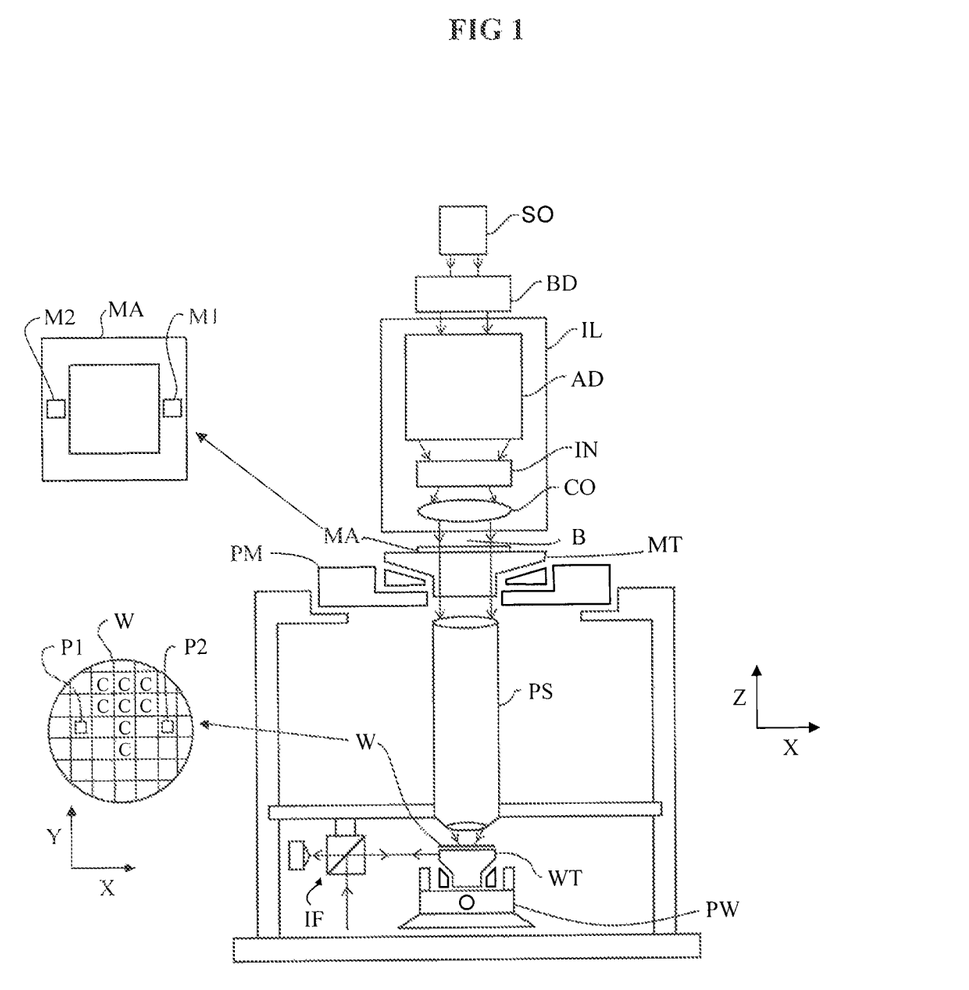
FIG. 1 depicts a lithographic apparatus according to an embodiment of the present invention.

FIG. 1 schematically depicts a lithographic apparatus according to one embodiment of the present invention. The apparatus includes an illumination system (illuminator) IL configured to condition a radiation beam B (e.g., UV radiation or any other suitable radiation), a mask support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is-reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long stroke frame LoS (see FIG. 2) moveable by a long stroke actuator and a short stroke frame SS moveable with respect to the long stoke frame by a shorts stroke actuator, which form part of the second positioner PW of FIG. 1. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
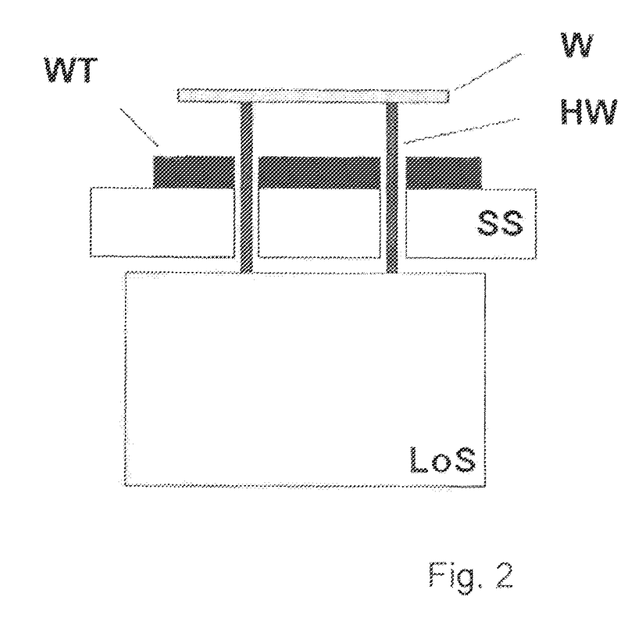
FIG. 2 depicts a detail of the lithographic apparatus according to an embodiment of the present invention, FIG. 3 discloses a control scheme for a controller according to an embodiment of the present invention, and, FIG. 4 discloses a schematic view on a controller according to an embodiment of the present invention.

FIG. 2 depicts a detail of the lithographic apparatus according to an embodiment of the present invention. The lithographic apparatus may be provided with a handler HW for transferring the object (e.g. substrate W) to or from the object table (e.g., substrate table WT). The handler HW may be constructed and arranged to move the substrate W up and down to the surface of the substrate table WT. The handler HW and the substrate table WT may be provided with a vacuum or an electrostatic clamp to clamp the substrate W to the handler HW or the substrate table WT. The handler HW may comprise a number of pins which are moveable through holes in the substrate table WT. Two of these pins are depicted in FIG. 2 but it may be advantageously to use three of them so as to keep the substrate in balance. The handler is mounted on the long stroke frame Los and the substrate table WT is moveable with respect to the long stroke frame Los by a short stroke actuator. During transfer there is a moment in which the position of the substrate W is determined by the handler HW and by the substrate table WT. Any movements between the handler HW and the substrate table WT during such moment may lead to tension within the substrate W and or wear on the substrate table surface and/or the handler HW. After the substrate W is clamped to the substrate table WT by electrostatic or vacuum clamping, the handler WH may be released from the substrate W. The tension that was caused during the clamping to the substrate table WT however may still be left in the substrate W and during exposure of the substrate. The tension may cause overlay errors because an exposed portion of the substrate may not be in the location where it may be expected to be and/or the exposed portion may be deformed.

Figure 3:
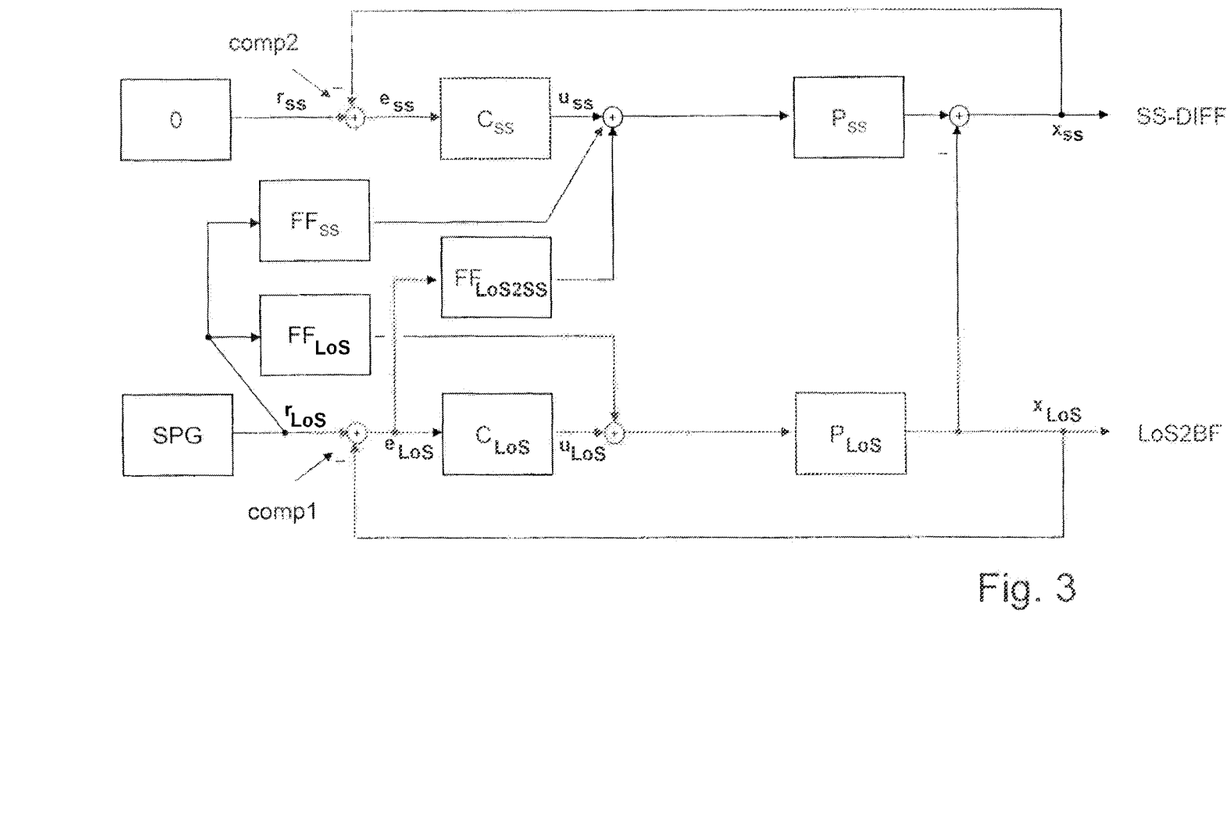

FIG. 3 discloses a control scheme for a controller operable connected with the actuator and/or the handler. Set point generator SPG generates a required position for the long stroke frame LoS (FIG. 2). This set point is used to determine a feed forward for the short stroke actuator via feed forward short stroke controller FFss and for the long stroke actuator via feed forward long stroke controller FFlos. Further the set point is compared with a measured position of the long stroke frame in comparator comp1 to calculate a positional error signal Elos. The positional error signal Elos is used as an input for a short stroke controller FFlos2ss and the long stroke controller Clos, which is of particular interest in this case of two subsystems being synchronized using a coupled measurement system. The short stroke controller FFlos2ss comprises a calculator constructed to calculate an output signal in a X and Y direction perpendicular to the transfer direction of the object and a rotational direction (RZ) around the transfer direction to control the short stroke actuator as a function of the input signal representative of the positional error Elos of the long stroke in X, Y and Rz. The output signal is combined with the feed forward signal from the feed forward short stroke controller FFss and a short stroke error signal Ess. The short stroke error signal Ess is calculated with the aid of a differential position sensor SS-Diff for measuring a position of the object table with respect to the long stroke frame. This measurement is compared with a required value which in this case is 0 by the second comparator comp 2 to determine the short stroke positional error Ess which is processed in the short stroke controller Css to determine a required force output Uss. The required force output, the output signal of the short stroke controller FFlos2ss and the feed forward of the FFss are added as an input for the short stroke actuator. The short stroke actuator, the object table WT, and the short stroke sensors are depicted as the short stroke system Pss in FIG. 3. The position of the object table WT SS-DIFF is used in a feedback loop to the second comperator comp2.

The long stroke controller Clos will use the positional error Elos to calculate a force Ulos which will added to the three calculated by the feed forward FFlos for the long stroke actuator to move the long stroke frame. The long stroke actuator, the long stroke frame and the longs stroke position sensors are depicted as the short stroke system Plos in FIG. 3. The position of the long stroke frame LoS2BF is feed back to the first comparator comp 1.

By having a feed forward from the long stroke actuator to the short stroke actuator by the short stroke controller FFlos2ss movement of the long stroke frame does not lead to large errors in the position of the substrate table as measured by the differential position sensor SS-DIFF. Movements between the handler HW which is mounted on the long stroke frame and the substrate table WT may be minimized in this way.

Figure 4:
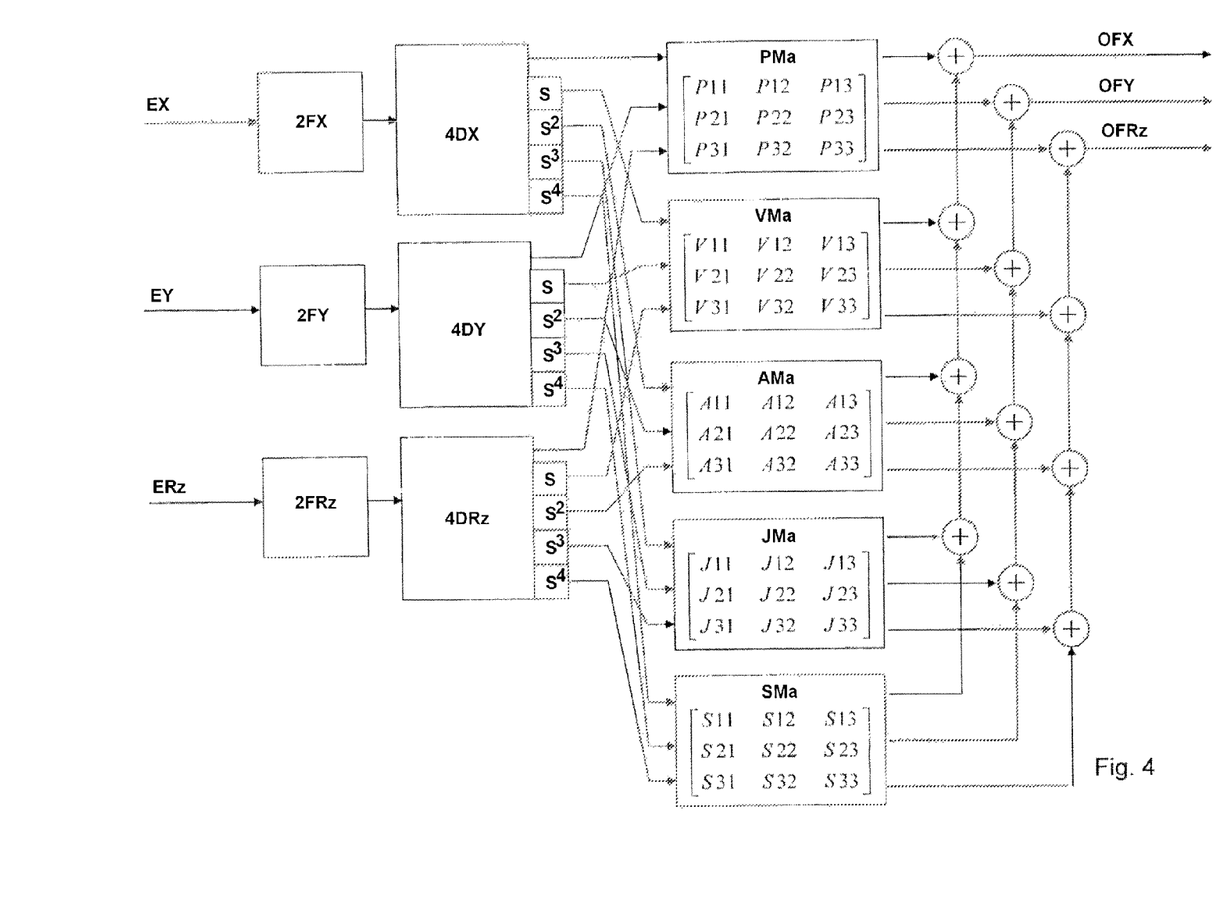

FIG. 4 discloses a schematic view on the short stroke controller FFlos2ss. A positional error in X, Y and Rz (EX, EY, and ERz) of the long stroke frame with respect to a pre-programmed position is filtered in second order filter 2FX, 2FY and 2FRz respectively. Subsequently the first, second, third and fourth derivative of this filtered error is calculated for the N, Y and Rz direction in calculator 4DX, 4DY and 4DRz respectively. The second order filter may be calibrated by hand and the calculators 4DX, 4DY and 4DRz may also be provided with additional filters that may be calibrated by hand. The filtered positional error in X, Y and Rz is fed to positional gain matrix PMa. The first derivative in X, Y and Rz is fed to velocity gain matrix VMa. The second derivative in X, Y and Rz is fed to acceleration gain matrix AMa. The third derivative in X, Y and Rz is fed to jerk gain matrix JMa. The fourth derivative in X, Y and Rz is fed to snap gain matrix SMa. The gain matrices may be calibrated using a least squares (LSQ) fit. The outputs of each gain matrix in X, Y and Rz are added so as to calculate a required force OFX, OFY, and OFRz respectively for the short stroke actuator. The short stroke controller FFlos2ss is only switched on when the substrate handler is transferring a substrate to or from the substrate table WT. During normal exposure the short stroke controller FFlkso2ss is switched off. The gain matrices PMa, VMa, AMa, JMa and SMa may be replaced by a Finite Impulse Response form or an Infinite Impulse Response form to have more freedom in the final order of the controller. During tests it may be estimated that the servo errors ess may be reduced by 50% if the short stroke controller FFlos2ss is switched on compared to a situation where the short stroke controller FFlos2ss is not switched on.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. For example, the present invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention.

Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A lithographic apparatus comprising:
   an object table configured to receive an object;
   an actuator configured to move the object table;
   a handler configured to transfer the object to or from the object table in a transfer direction; and
   a controller configured to control a movement of the object table and a movement of the handler in a direction perpendicular to the transfer direction to minimize relative movement between the object table and the handler during transfer of the object to or from the object table.

2. The lithographic apparatus according to claim 1, wherein:
   the handler is configured to move the object in the transfer direction; and
   the controller is coupled to the actuator and is configured to actuate the actuator in the direction perpendicular to the transfer direction to follow the movement of the handler in the perpendicular direction.

3. The lithographic apparatus according to claim 1, wherein the handler is configured to:
   move the object in the transfer direction; and
   follow the object table in the direction perpendicular to the transfer direction.

4. The lithographic apparatus according to claim 1, wherein the actuator comprises a short stroke actuator and a long stroke actuator.

5. The lithographic apparatus according to claim 4, wherein the handler is mounted on a long stroke frame, the long stroke frame being moveable by the long stroke actuator.

6. The lithographic apparatus according to claim 5, further comprising a differential position sensor configured to measure a position of the object table with respect to the long stroke frame.

7. The lithographic apparatus according to claim 4, wherein the controller comprises a short stroke controller configured to control the short stroke actuator, the controlled short stroke actuator being configured to move the object table such that the object table follows the handler in the direction perpendicular to the transfer direction.

8. The lithographic apparatus according to claim 7, wherein the short stroke controller is further configured to receive an input signal representative of a positional error of the long stroke frame with respect to a pre-programmed position.

9. The lithographic apparatus according to claim 8, wherein the positional error of the long stroke frame is in the direction perpendicular to the transfer direction and in a rotational direction around the transfer direction.

10. The lithographic apparatus according to claim 8, wherein the short stroke controller comprises a calculator configured to calculate an output signal to control the short stroke actuator as a function of the input signal representative of the positional error of the long stroke frame.

11. The lithographic apparatus according to claim 10, wherein the calculator of the short stroke controller is configured to calculate an output signal in the direction perpendicular to the transfer direction and in a rotational direction around the transfer direction to control the short stroke actuator as a function of the input signal representative of the positional error of the long stroke frame.

12. The lithographic apparatus according to claim 10, wherein the calculator is configured to calculate a first, second, third, and fourth derivative of the input signal representative of the positional error of the long stroke frame to calculate the output signal to control the short stroke actuator.

13. The lithographic apparatus according to claim 12, wherein the short stroke controller further comprises a gain matrix for each of the first, second, third, and fourth derivative to calculate the output signal to control the short stroke actuator.

14. The lithographic apparatus according to claim 7, wherein the short stroke controller comprises an input coupled to a differential position sensor.

15. A device manufacturing method comprising:
    transferring, using a handler, an object to or from an object table in a transfer direction; and
    controlling, using a controller, a movement of the handler and a movement of the object table in a direction perpendicular to the transfer direction to minimize relative movement between the object table and the handler during transfer.

16. The method according to claim 15, wherein the controlling comprises actuating a short stroke actuator coupled to the object table in the direction perpendicular to the transfer direction to follow the movement of the handler in the perpendicular direction during transfer of the object to or from the object table.

17. The method according to claim 15, wherein the controlling comprises actuating a long stroke actuator coupled to the handler in the direction perpendicular to the transfer direction to follow the movement of the object table in the perpendicular direction during transfer of the object to or from the object table.

* * * * *